United States Patent
Lue et al.

(10) Patent No.: US 7,851,848 B2
(45) Date of Patent: Dec. 14, 2010

(54) CYLINDRICAL CHANNEL CHARGE TRAPPING DEVICES WITH EFFECTIVELY HIGH COUPLING RATIOS

(75) Inventors: Hang Ting Lue, Hsinchu (TW); Tzu Hsuan Hsu, Jhongpu Township (TW)

(73) Assignee: Macronix International Co., Ltd., Hsinchu (TW)

( * ) Notice: Subject to any disclaimer, the term of this patent is extended or adjusted under 35 U.S.C. 154(b) by 311 days.

(21) Appl. No.: 11/756,557

(22) Filed: May 31, 2007

(65) Prior Publication Data

US 2008/0099830 A1 May 1, 2008

Related U.S. Application Data

(60) Provisional application No. 60/863,861, filed on Nov. 1, 2006.

(51) Int. Cl.
*H01L 29/792* (2006.01)
(52) U.S. Cl. .................. 257/324; 257/E29.309
(58) Field of Classification Search ............... 257/324, 257/686, 690, E29.309, E21.423
See application file for complete search history.

(56) References Cited

U.S. PATENT DOCUMENTS

| | | | |
|---|---|---|---|
| 4,630,086 A | 12/1986 | Sato et al. | |
| 5,286,994 A | 2/1994 | Ozawa et al. | |
| 5,319,229 A | 6/1994 | Shimoji et al. | |
| 5,889,304 A | 3/1999 | Watanabe et al. | |
| 5,952,692 A | 9/1999 | Nakazato et al. | |
| 5,981,404 A | 11/1999 | Sheng et al. | |
| 6,011,725 A | 1/2000 | Eitan et al. | |
| 6,026,026 A | 2/2000 | Chan et al. | |
| 6,074,917 A | 6/2000 | Chang et al. | |
| 6,169,693 B1 | 1/2001 | Chan et al. | |
| 6,218,700 B1 | 4/2001 | Papadas et al. | |
| 6,512,696 B1 | 1/2003 | Fan et al. | |

(Continued)

FOREIGN PATENT DOCUMENTS

CN 1400669 A 3/2003

(Continued)

OTHER PUBLICATIONS

Search Report from copending corresponding European Patent Application No. EP 1 918 984 mailed Apr. 21, 2008, 4 pages.

(Continued)

*Primary Examiner*—Roy K Potter
(74) *Attorney, Agent, or Firm*—Haynes Beffel & Wolfeld LLP

(57) ABSTRACT

A memory cell comprising: a source region and a drain region separated by a semiconductor channel region, the channel region having a channel surface having an area A1 including a first cylindrical region, a first dielectric structure on the channel surface, a dielectric charge trapping structure on the first dielectric structure, a second dielectric structure on the dielectric charge trapping structure, a conductive layer having a conductor surface having an area A2 including a second cylindrical region on the second dielectric structure, the conductor surface overlying the dielectric charge trapping structure and the channel surface of the channel region, and the ratio of the area A2 to the area A1 being greater than or equal to 1.2 are described along with devices thereof and methods for manufacturing.

28 Claims, 10 Drawing Sheets

U.S. PATENT DOCUMENTS

| | | |
|---|---|---|
| 6,642,090 B1 | 11/2003 | Fried et al. |
| 6,657,252 B2 | 12/2003 | Fried et al. |
| 6,709,928 B1 | 3/2004 | Jenne et al. |
| 6,720,630 B2 | 4/2004 | Mandelman et al. |
| 6,768,166 B2 | 7/2004 | Hagemeyer |
| 6,784,480 B2 | 8/2004 | Bhattacharyya |
| 6,812,075 B2 | 11/2004 | Fried et al. |
| 6,815,268 B1 | 11/2004 | Yu et al. |
| 6,818,558 B1 | 11/2004 | Rathor et al. |
| 6,858,906 B2 | 2/2005 | Lee et al. |
| 6,897,533 B1 | 5/2005 | Yang et al. |
| 6,912,163 B2 | 6/2005 | Zheng et al. |
| 7,052,958 B1 | 5/2006 | Fried et al. |
| 7,053,447 B2 * | 5/2006 | Verhoeven .................. 257/324 |
| 7,075,828 B2 | 7/2006 | Lue et al. |
| 7,091,551 B1 | 8/2006 | Anderson et al. |
| 7,115,469 B1 | 10/2006 | Halliyal et al. |
| 7,115,942 B2 | 10/2006 | Wang |
| 7,133,313 B2 | 11/2006 | Shih et al. |
| 7,151,692 B2 | 12/2006 | Wu et al. |
| 7,164,603 B2 | 1/2007 | Shih et al. |
| 7,187,590 B2 | 3/2007 | Zous et al. |
| 7,190,614 B2 | 3/2007 | Wu et al. |
| 7,209,390 B2 | 4/2007 | Lue et al. |
| 7,262,084 B2 | 8/2007 | Zhu et al. |
| 7,298,004 B2 | 11/2007 | Specht et al. |
| 7,314,787 B2 | 1/2008 | Yagishita et al. |
| 7,348,246 B2 | 3/2008 | Kim et al. |
| 7,371,638 B2 | 5/2008 | Cho et al. |
| 2003/0015755 A1 | 1/2003 | Hagemeyer |
| 2003/0030100 A1 | 2/2003 | Lee et al. |
| 2003/0032242 A1 | 2/2003 | Lee et al. |
| 2003/0042534 A1 | 3/2003 | Bhattacharyya |
| 2003/0146465 A1 | 8/2003 | Wu |
| 2003/0224564 A1 | 12/2003 | Kang et al. |
| 2004/0079983 A1 | 4/2004 | Chae et al. |
| 2004/0183126 A1 | 9/2004 | Bae et al. |
| 2004/0207002 A1 | 10/2004 | Ryu et al. |
| 2004/0251487 A1 | 12/2004 | Wu et al. |
| 2004/0256679 A1 | 12/2004 | Hu |
| 2005/0006696 A1 | 1/2005 | Noguchi et al. |
| 2005/0023603 A1 | 2/2005 | Eldridge et al. |
| 2005/0074937 A1 | 4/2005 | Jung |
| 2005/0093054 A1 | 5/2005 | Jung |
| 2005/0219906 A1 | 10/2005 | Wu |
| 2005/0237801 A1 | 10/2005 | Shih |
| 2005/0237809 A1 | 10/2005 | Shih et al. |
| 2005/0237813 A1 | 10/2005 | Zous et al. |
| 2005/0237815 A1 | 10/2005 | Lue et al. |
| 2005/0237816 A1 | 10/2005 | Lue et al. |
| 2005/0260814 A1 | 11/2005 | Cho et al. |
| 2005/0270849 A1 | 12/2005 | Lue |
| 2005/0272190 A1 | 12/2005 | Lee et al. |
| 2005/0281085 A1 | 12/2005 | Wu |
| 2006/0029887 A1 | 2/2006 | Oh et al. |
| 2006/0046388 A1 | 3/2006 | Park et al. |
| 2006/0097310 A1 | 5/2006 | Kim et al. |
| 2006/0198189 A1 | 9/2006 | Lue et al. |
| 2006/0198190 A1 | 9/2006 | Lue |
| 2006/0202252 A1 | 9/2006 | Wang et al. |
| 2006/0202261 A1 | 9/2006 | Lue et al. |
| 2006/0234456 A1 | 10/2006 | Anderson et al. |
| 2006/0258090 A1 | 11/2006 | Bhattacharyya et al. |
| 2006/0261401 A1 | 11/2006 | Bhattacharyya |
| 2006/0281260 A1 | 12/2006 | Lue |
| 2006/0284245 A1 | 12/2006 | Park et al. |
| 2007/0012988 A1 | 1/2007 | Bhattacharyya |
| 2007/0029625 A1 | 2/2007 | Lue et al. |
| 2007/0031999 A1 | 2/2007 | Ho et al. |
| 2007/0045718 A1 | 3/2007 | Bhattacharyya |
| 2007/0069283 A1 | 3/2007 | Shih et al. |
| 2007/0200168 A1 | 8/2007 | Ozawa et al. |
| 2008/0150029 A1 | 6/2008 | Zheng et al. |

FOREIGN PATENT DOCUMENTS

| | | |
|---|---|---|
| EP | 0016246 | 10/1980 |
| EP | 1411555 | 4/2004 |
| FR | 2826510 | 12/2002 |
| JP | 11040682 | 2/1999 |
| JP | 2004363329 | 12/2004 |
| KR | 20050121603 | 12/2005 |

OTHER PUBLICATIONS

Hijaya, S., et al., "High-Speed Write/Erase EAROM Cell with Graded Energy Band-Gap Insulator," Electronics and Communications in Japan, Part 2, vol. 68, No. 2, Jun. 6, 1984, 28-36.

Hinkle, C.L., et al., "Enhanced tunneling in stacked gate dielectrics with ultra-thin HfO2 (ZrO2) layers sandwiched between thicker SiO2 layers," Surface Science, Sep. 20, 2004, vol. 566-568, 1185-1189.

Buckley, J., et al., "Engineering of 'Conduction band—Crested Barriers' or 'Dielectric Constant—Crested Barriers' in view of their application of floating-gate non-volatile memory devices," VLSI 2004, 55-56.

White et al., "On the Go with SONOS" IEEE Circuits and Devices, Jul. 2000, 22-31.

Walker et al., "3D TFT-SONOS Memory Cell for Ultra-High Density File Storage Applications," 2003 Symposium on VLSI Tech Digest of Technical Papers, 29-30.

Minami, et al., "New Scaling Guidelines for MNOS Nonvolatile Memory Devices," IEEE Trans on Electron Devices 38(11) Nov. 1991 2519-2526.

Ito, et al., "A Novel MNOS Technology Using Gate Hole Injection in Erase Operation for Embedded Nonvolatile Memory Applications," 2004 Symp. on VLSI Tech Dig. of Papers 2004, 80-81.

Eitan, et al., "NROM: A Novel Localized Trapping, 2-Bit Nonvolatile Memory Cell," IEEE Electron Device Lett 21(11) Nov. 2000, 543-545.

Chindalore, et al., "A New Combination-Erase Technique for Erasing Nitride Based (SONOS) Nonvolatile Memories," IEEE Electron Dev. Lett. 24(4) Apr. 2003, 257-259.

DiMaria, D.J., et al., "Conduction Studies in Silicon Nitride: Dark Currents and Photocurrents," IBM J. Res. Dev. May 1977, 227-244.

Yeh, C.C., et al., "PHINES: A Novel Low Power Program/Erase, Small Pitch, 2-Bit per Cell Flash Memory," IEDM Tech. Dig. 2002, 931-934.

Takata, M., et al., "New Non-Volatile Memory with Extremely High Density Metal Nano-Dots," IEEE IEDM 03-553, 22.5.1-22.5.4.

Lee, Chungho, et al., "Operational and Reliability Comparison of Discrete-Storage Nonvolatile Memories: Advantages of Single-and Double-Layer Metal Nanocrystals," IEEE IEDM 03-557 22.6.1-22.6..4.

Baik, Seung, et al., "High Speed and Nonvolatile Si Nanocrystal Memory for Scaled Flash Technology using Highly Field-Sensitive Tunnel Barrier," IEEE IEDM 03-545 22.3.1-22.3.4.

Lee, Chang, et al., "A Novel SONOS Structure of SiO2/SiN/Al2O3 with TaN Metal Gate for Multi-Giga Bit Flash Memeries," IEEE 2003 4 pages.

Padilla, Alvaro, et al., "Dual-Bit SONOS FinFET Non-Volatile Memory Cell and New Method of Charge Detection," Int'l Symp on VLSI Technology, Systems and Applications, 2007, Apr. 23-25, 2007, pp. 1-2.

Wu, W.-C., et al., "Highly Reliable Multilevel and 2-bit/cell Operation of Wrapped Select Gate (WSG) SONOS Memory," IEEE Electron Device Letters, vol. 28, Issue 3, Mar. 2007, 214-216.

Maikap, S., et al., "High-k HfO2/TiO2/HfO2 multilayer quantum well flash memory devices," Int'l Symp on VLSI Technology, Sytems and Applications Apr. 23-25, 2007, pp. 1-2.

Mikolajick, T., et al., "The Future of Charge Trapping Memories," Int'l Symp on VLSI Technology, Systems and Applications, Apr. 23-25, 2007, pp. 1-4.

Kim, Moon Kyung, et al., "The Effects of ONO thickness on Memory Characteristics in Nano-scale Charge Trapping Devices," Int'l Symp on VLIS Technology, Systems and Applications, Apr. 23-25, 2007, pp. 1-2.

Lai, Sheng-Chih, et al., "A Study on the Erase and Retention Mechanisms for MONOS, MANOS, and BE-SONOS Non-Volatile Memory Devices," Int'l Symp on VLSI Technology, Systems and Applications, Apr. 23-25, 2007, pp. 1-2.

Wen, Huang-Chun, et al., "Issues associated with p-type band-edge effective work function metal electrodes: Fermi-level pinning and flatband roll-off," Int'l Symp on VLSI Technology, Systems and Applications, Apr. 23-25, 2007.

Wen, Huang-Chun, et al., "Issues associated with p-type band-edge effective work function metal electrodes: Fermi-level pinning and flatband roll-off," Int'l Symp on VLSI Technology, Systems and Applications, Apr. 23-25, 2007, pp. 1-2.

Tsai, Ping-Hung, et al., "Novel SONOS-Type Nonvolatile Memory Device with Suitable Band Offset in HfAIO Charge-Trapping Layer," Int'l Symp on VLSI Technology, Systems and Applications, Apr. 23-25, 2007, pp. 1-2.

Lue, Hang-Ting, et al., "A BE-SONOS (Bandgap Engineered SONOS) NAND for Post-Floating Gate Era Flash Memory," Int'l Symp on VLSI Technology, Apr. 23-25, 2007, pp. 1-2.

Cho, et al., "Simultaneous Hot-Hole Injection at Drain and Source for Efficient Erase and Excellent Endurance in SONOS Flash EEPROM Cells," IEEE Electron Device Letters, vol. 24, No. 4, Apr. 2003, 260-262.

Shih et al., "A Novel 2-bit/cell Nitride Storage Flash Memory with Greater than 1M P/E-cycle Endurance," IEEE IEDM 2004 881-884 (36.3.1-36.3.4).

Blomme et al., "Multilayer tunneling barriers for nonvolatile memory applications," Device Research Conf. 2002 60th DRC Digest 153-154.

Blomme et al., "Write/Erase Cycling Endurance of Memory Cells with SiO2/HfO2 Tunnel Dielectric," IEEE Trans. on Dev. and Materials Reliability 4(3), Sep. 2004 345-351.

Govoreanu et al., "VARIOT: A Novel Multilayer Tunnel Barrier Concept for Low-Voltage Nonvolatile Memory Devices," IEEE Electron Dev. Lett. 24(2) Feb. 2003 94-10.

Govoreanu et al., "Simulation of Nanofloating Gate Memory with High-k Stacked Dielectrics," IEEE SISPAD Intl. Conf. Sep. 3-5, 2003 299-302.

Govoreanu et al., "An Investigation of the Electron Tunneling Leakage Current Through Ultrathin Oxides/High-k Gate Stacks at Inversion Conditions," IEEE SISPAD Intl. Conf. Sep. 3-5, 2003 287-290.

Kim et al., "Robust Multi-Bit Programmable Flash Memory Using a Resonant Tunnel Barrier," Electron Dev. Mtg. Dec. 5-7, 2005, IEDM Technical Digest 861-864.

Likharev, "Layered Tunnel Barriers for Nonvolatile Memory Devices," Appl. Phys. Lett. 73(15) Oct. 1998 2137-2139.

Lue et al., "BE-SONOS: A Bangap Engineered SONOS with Excellent Performance and Reliability," IEDM Tech. Digest Dec. 2005 547-550.

Sung et al., "Multi-Layer SONOS with Direct Tunnel Oxide for High Speed and Long Retention Time," IEEE Silicon Nanoelectronics Workshop Jun. 2002 83-84.

Aminzadeh et al., "Conduction and Charge Trapping in Polysilicon-Silicon Nitride-Oxide-Silicon Structures under Positive Gate Bias," IEEE Trans. on Electron Dev. 35(4) Apr. 1998 459-467.

Yamada et al., "A self-convergence erasing scheme for a simple stacked gate flash EEPROM," Proc. Int'l. Electron Devices Meeting, Dec. 1991 307-310.

Cho et al., "Simultaneous Hot-Hole Injection at Drain and Source for Efficient Erase and Excellent Endurance in SONOS Flash EEPROM Cells," IEEE Electron Device Lett., vol. 24, No. 4, Apr. 2003, 260-262.

Blomme, et al., "Multilayer tunneling barriers for nonvolatile memory applications," 60th Device Resarch Conf., 2002, Conf. Digest 153-154.

Blomme, et al., Write/Erase Cycling Endurance of Memory Cells with SiO2/HfO2 Tunnel Dielectric, IEEE Trans on Device and Materials Reliability, vol. 4, No. 3, Sep. 2004, 345-351.

Govoreanu, et al, "VARIOT: A Novel Multilayer Tunnel Barrier Concept for Low-Voltage Nonvolatile Memory Devices," IEEE Electron Device Lett., vol. 24, No. 2, Feb. 2003, 99-101.

Lue et al., "BE-SONOS: A Bandgap Engineered SONOS with Excellent Performance and Reliability," IEDM Tech Digest, IEEE Int'l Dec. 2005, 547-550.

Sung, et al., "Multi-layer SONOS with Direct Tunnel Oxide for High Speed and Long Retention Time," IEEE 2002 Nanoelectronics Workshop, Jun. 2002, 83-84.

Yamada, et al., "A self-convergence erasing scheme for a simple stacked gate flash EEPROM," Proc. of the Int'l Electron Dev. Mtg., IEEE Dec. 1991, 307-310.

Lue et al., "A Novel P-Channel NAND-Type Flash memory with 2-bit/cell Operation and High Programming Throughput (>20 MB/sec)," IEEE 2005, 4 pages.

Tsai et al., "Novel SONOS-Type Nonvolatile Memory Device with Suitable Band Offset in HfAIO Charge-Trapping Layer," Int'l Symp. on VLSI Tech, Systems and Applications, Apr. 23-25, 2007, 2 pages.

Lue et al., "A BE-SONOS (Bandgap Engineered SONOS) NAND for Post-Floating Gate Era Flash Memory," Int'l Symp on VLSI Tech, Apr. 23-25, 2007, 2 pages.

Cho, Eun Suk, et al., "Technology Breakthrough of Body-Tied FinFET for sub 50 nm NOR Flash Memory," 2006 Symp. on VLSI Tech Digest of Papers, 2 pages, Jun. 2006.

Ahn, Young Joon, et al., "Trap Layer Engineered FinFET NAND Flash with Enhanced Memory Window," 2006 Symp. on VLSI Tech. Digest of Papers, Jun. 2006, 2 pages.

Sung, Suk-Kang, et al., "SONOS-type FinFET Device Using P+Poly-Si Gate and High-K Blocking Dielectric Integrated on Cell Array and GSL/SSL for Multi-Gigabit NAND Flash Memory," 2006 Symp. on VLSI Tech. Digest of Papers, Jun. 2006, 2 pages.

Kim, Sukpil, et al., "Paired FinFET Charge Trap Flash Memory for Vertical High Density Storage," 2006 Symp. on VLSI Tech. Digest of Papers, Jun. 2006, 2 pages.

Fried, David M., et al., "Improved Independent Gate N-Type FinFET Fabrication and Characterization," IEEE Electron Device Letters, vol. 24, No. 9, Sep. 2003, 3 pages.

Huang, Xuejue, et al., "Sub-50 nm P-Channel FinFET," IEEE Trans. on Electron Devices, vol. 48, No. 5, May 2001, 7 pages.

King, Tsu-Jae, "Advanced FET Structures for Future CMOS Technology," Infineon, Jun. 30, 2004, 21 pages.

Xuan, Peiqi, et al., "FinFET SONOS Flash Memory for Embedded Applications," IEEE IEDM, 2003, 4 pages, Dec. 2003.

* cited by examiner

CYLINDRICAL CHANNEL CHARGE TRAPPING DEVICES WITH EFFECTIVELY HIGH COUPLING RATIOS

RELATED APPLICATIONS

This application claims the benefit of U.S. Provisional Application No. 60/863,861 filed 1 Nov. 2006, which is hereby incorporated by reference into this application.

BACKGROUND OF THE INVENTION

1. Field of the Invention

The invention relates generally to non-volatile memory devices, and in particular to flash memory cells and manufacturing of flash memory devices.

2. Description of Related Art

Flash memory technology includes memory cells that store charge between the channel and gate of a field effect transistor. The charge stored affects the threshold of the transistor, and the changes in threshold due to the stored charge can be sensed to indicate data.

One type of charge storage memory cell in widespread application is known as a floating gate memory cell. In a floating gate memory cell, a tunnel dielectric is formed over a semiconductor channel, a floating gate of conductive material such as polysilicon is formed over the tunnel dielectric, and an inter-poly dielectric is formed over the floating gate to isolate it from the word line or control gate of the memory cell. A floating gate memory cell is modeled as a first capacitor between the control gate and the floating gate, and a second capacitor between the floating gate and the channel. The coupling ratio is based on the capacitor divider formula that determines the voltage coupled to the floating gate by a voltage applied across the control gate and the channel. Devices are typically made to have a higher capacitance between the control gate and the floating gate than between the floating gate and the channel by engineering the materials and the area of the floating gate relative to the control gate and the channel. For example, floating gates are implemented using a T-shape or a U-shape, which results in a greater surface area between the control gate and the floating gate than between the floating gate and the channel, and thereby a greater capacitance between the floating gate and the control gate. This results in more voltage coupled to the floating gate, enhancement of the electric field across the tunnel oxide, and increased program/erase efficiency. Although this technology has been widely successful, as the sizes of the memory cells and the distances between them shrink, the floating gate technology starts to degrade because of interference between neighboring floating gates.

Another type of memory cell based on storing charge between the channel and gate of a field effect transistor uses a dielectric charge trapping structure. In this type of memory cell, a dielectric charge trapping structure is formed over a tunnel dielectric which isolates the dielectric charge trapping structure from the channel, and a top dielectric layer is formed over the charge trapping structure to isolate it from the word line or gate. A representative device is known as a silicon-oxide-nitride-oxide-silicon SONOS cell. SONOS-type devices, and other charge trapping memory cell technologies that use a non-conductive charge trapping structure, are recently proposed to solve the floating gate interference issue, and they are predicted to perform well below a 45 nm critical dimension, or manufacturing node. However, because the charge trapping layer is not conductive, the series capacitor model of floating gate devices does not apply. Therefore, increasing the area of the control gate and charge trapping structure does not increase a coupling ratio as occurs in a floating gate device. Rather, the electric field when no charge is trapped in the charge trapping structure is equal in the tunneling dielectric and the top dielectric. The program/erase efficiency of a charge trapping memory cell with a dielectric charge trapping structure, like a SONOS-type device, cannot be improved by the coupling ratio engineering known from the floating gate technology.

Therefore, it is desirable to have a dielectric charge trapping memory cell with the electric field strength in the tunneling dielectric greater than the electric field strength in the top dielectric when no charge is trapped in the charge trapping structure for a bias voltage between the channel and the gate, resulting in increased program/erase efficiency.

SUMMARY OF THE INVENTION

The present invention relates to non-volatile memory devices, and more specifically to dielectric charge trapping memory cells where the electric field strength at the interface between the channel and the bottom dielectric is greater than the electric field strength at the interface between the conductive layer and the top dielectric when no charge is trapped in the dielectric charge trapping structure for a given bias voltage between the channel and the conductive layer. Memory cells as described herein have a dielectric charge trapping structure, for example SONOS-type or bandgap-engineered SONOS (BE-SONOS) type memory cells.

Accordingly, an embodiment described herein includes a memory cell including a source region and a drain region separated by a semiconductor channel region having a channel surface including a cylindrical region. A first dielectric structure (bottom dielectric) on the channel surface, a dielectric charge trapping structure on the first dielectric structure, a second dielectric structure (top dielectric) on the dielectric charge trapping structure, and a conductive layer having a conductor surface also including a cylindrical region on the second dielectric structure are included. The conductor surface overlies the dielectric charge trapping structure and the channel surface of the channel region, defining a memory cell in which the potential on the channel surface and the charge in the charge trapping structure control the channel. An area A1 consisting of the area of the channel surface, and an area A2 consisting of the area of the conductor surface over the channel surface are defined by the structure, where the ratio of the area A2 to the area A1 is greater than or equal to 1.2, and can be as much as about 2 or more. The term about is intended herein to allow for variations that arise due to the process limitations that affect the areas and thicknesses of the materials, in nanometer scale structures. The ratio of the area A2 to the area A1 acts to establish a greater electric field strength at the interface between the channel surface and the bottom dielectric than the electric field strength at the interface between the conductor surface and the top dielectric when no charge is trapped in the charge trapping structure for a given bias voltage between the channel region and the conductive layer.

In some embodiments the memory cell comprises a semiconductor fin structure, wherein the semiconductor channel region is on the semiconductor fin structure. In some embodiments the first cylindrical region of the channel surface has an average radius that is less than the effective oxide thickness of the structures between the channel surface and the conductor surface. In some embodiments the first dielectric structure comprises silicon dioxide. In some embodiments the first dielectric structure comprises a bandgap engineered tunneling barrier structure. In some embodiments the bandgap engineered tunneling barrier structure comprises multiple layers, an example of which comprises a first silicon dioxide layer, a silicon nitride layer on the first silicon dioxide layer, and a second silicon dioxide layer on the silicon nitride layer. In some embodiments the dielectric charge trapping structure comprises silicon nitride, a metal oxide or nano-particle trapping materials. In some embodiments the second dielectric structure comprises silicon dioxide, or other dielectric including high K dielectrics like aluminum oxide or other metal oxides. In some embodiments the top conductive layer comprises polysilicon, silicide and/or metal.

An integrated circuit memory device including cells implemented as described above is also described.

A method for manufacturing a memory cell as described herein comprises forming a source region and a drain region by implanting dopants in a semiconductor substrate, forming a semiconductor channel region with a channel surface such that the source region and the drain region are separated by the channel region, the channel surface having an area A1 including a first cylindrical region, forming a first dielectric structure referred to as a tunneling dielectric on the channel surface, forming a dielectric charge trapping structure on the first dielectric structure, forming a second dielectric structure on the dielectric charge trapping structure, and forming a conductive layer having a conductor surface having an area A2 including a second cylindrical region on the second dielectric structure, such that the conductor surface is overlying the dielectric charge trapping structure and the channel surface of the channel region, such that the ratio of area A2 to area A1 is greater than or equal to 1.2, or in some embodiments as much as about 2 or more.

In certain embodiments a method of manufacturing includes forming a plurality of memory cells.

Other aspects and advantages of the present invention can be seen on review of the drawings, the detailed description and the claims, which follow.

DETAILED DESCRIPTION

A detailed description of various embodiments is provided with reference to FIGS. 1-16.

Figure 1:
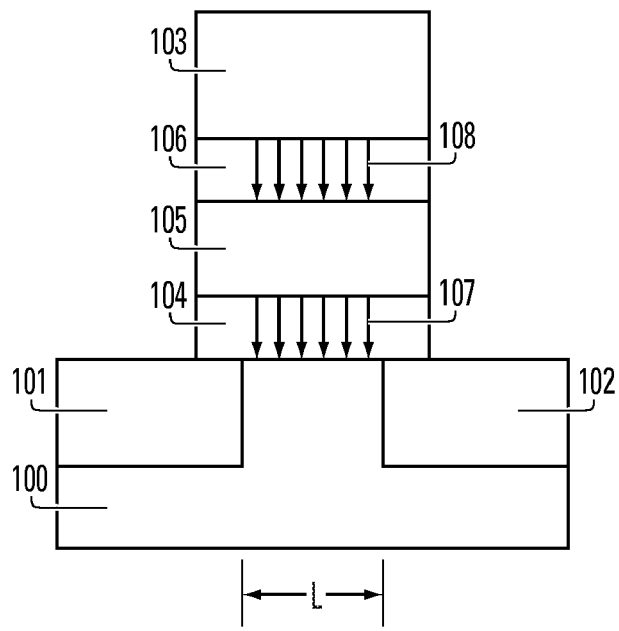
FIG. 1 illustrates the basic structure of a prior art SONOS-type memory cell.

FIG. 1 illustrates the basic structure of a prior art SONOS-type memory cell. The memory cell is formed on a semiconductor substrate 100 in which a first doped region 101 acts as a source region and a second doped region 102 acts as a drain region. The channel of the memory cell is the region of the substrate 100 between the source region 101 and the drain region 102. A conductive layer 103 is formed over a multi-layer dielectric structure which includes a first dielectric 104, a dielectric charge trapping structure 105, and a second dielectric 106. The dimension L shown in FIG. 1 is typically referred to as the channel length L because current flows between the source region 101 and the drain region 102. In a planar device as shown in FIG. 1, the charge trapping structure is stacked over a flat surface over the channel. The cross-section shown in FIG. 1 is taken in the gate length direction so that the surface of the channel between the source region 101 and the drain region 102 is flat. Also, a cross-section taken of the planar device in the gate width direction of the planar device is also essentially flat. In this structure the electric field 107 in the first dielectric 104 will be the same strength as the electric field 108 in the second dielectric 106 assuming there is no charge trapped in the dielectric charge trapping structure 105.

A memory device and method to make the device based on dielectric charge trapping technology are described herein, designed so that the electric field strength at the interface between the channel surface and the first dielectric structure is greater than the electric field at the interface between the conductor surface and the second dielectric structure when no charge is trapped in the charge trapping structure for a given bias voltage between the one or more of channel region, source region and drain region and the conductive layer. Therefore, the device can be said to have a high "effective" gate coupling ratio GCR, resulting in efficient programming and erasing of the device by utilizing a tunneling mechanism to increase or decrease the amount of charge trapped in the charge trapping structure. Devices as described herein are based on memory cells having a dielectric charge trapping structure, such as SONOS-type or bandgap-engineered SONOS (BE-SONOS) type devices, that include a channel region from a source region to a drain region, the channel region having a channel surface including a cylindrical region, with the channel surface in contact with the first dielectric structure. Devices described herein include a dielectric charge trapping structure on the first dielectric structure and a second dielectric structure on the dielectric charge trapping structure. Devices described herein also include a conductive layer having a conductor surface also including a cylindrical region on the second dielectric structure, the conductor surface overlying the dielectric charge trapping structure and the channel surface, such that the ratio of the area A2 of the conductor surface to the area A1 of the channel surface is greater than or equal to 1.2, including as much as about 2 or more. The ratio of the area A2 to the area A1 acts to establish the electric field strength at the interface between the channel surface and the first dielectric structure greater than the electric field strength at the interface between the conductor surface and the second dielectric structure when no charge is trapped in the charge trapping structure for a given bias voltage between the channel region and the conductive layer.

A channel surface as contemplated herein is defined essentially by the length and width of the channel surface which interacts with the charge trapping structure. The channel width can be defined with reference to a channel surface cross-section taken along the channel width dimension of the device, such that the channel surface cross-section extends along the channel length dimension of the device to define the area of the channel surface. The channel surface cross-section is defined by the structure of the device and comprises at least some of the interface between the channel region and the first dielectric structure.

A conductor surface as contemplated herein is defined essentially by the length and width of the conductor surface which interacts with the charge trapping structure. The width of the conductor surface can be defined with reference to a conductor surface cross-section taken along the channel width dimension of the device, such that the conductor surface cross-section extends along the channel length dimension of the device to define the area of the conductor surface. The conductor surface cross-section is defined by the structure of the device and comprises at least some of the interface between the conductive layer and the second dielectric structure.

A cylindrical region as contemplated herein has a curvature that can be expressed as the curvature of a surface traced by a line moving parallel to a fixed line (e.g. an axis of a circular surface) extending in the length direction of the device, and intersecting a fixed curve (e.g. a circle-like curve for a circular surface). In a practical device, the fixed curve can be approximately circular, or have another shape yielding the "effective coupling ratio" improvements as described herein. Of course, the "fixed curve" need not be a circle and the "line" moved parallel to the fixed line need not be a straight line in actual devices.

Figure 2:
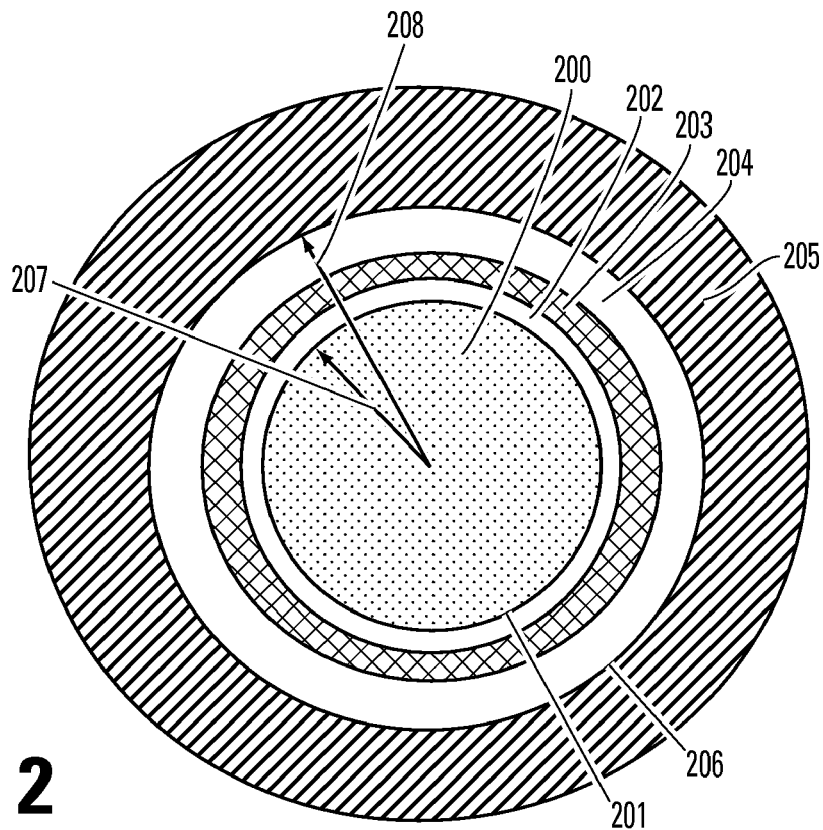
FIG. 2 illustrates a cross-sectional view taken along the channel width dimension of a dielectric charge trapping memory cell in accordance with one embodiment.

FIG. 2 illustrates a cross-sectional view taken along the channel width dimension W of a dielectric charge trapping memory cell in accordance with one embodiment. In the embodiment illustrated in FIG. 2, the channel region 200 has a channel surface 201, a first dielectric structure 202 is on the channel surface 201, a dielectric charge trapping structure 203 is on the first dielectric structure 202, a second dielectric structure 204 is on the dielectric charge trapping structure 203, and a conductive layer 205 having a conductor surface 206 on the second dielectric structure 204, the conductor surface 206 overlying the dielectric charge trapping structure 203 and the channel surface 201. In the embodiment illustrated in FIG. 2, the source region and drain region are below the plane of the cross-section illustrated in FIG. 2 and above the plane of the cross-section illustrated in FIG. 2 respectively, such that the length of the channel surface 201 and the length of the conductor surface 206 are the distance along the channel region 200 from the source region to the drain region. In some embodiments, the channel region 200 may be a pillar with an N+ doped base forming a source region, a P or P-doped channel region in the middle portion of the pillar surrounded by the dielectric charge trapping structure 203, and an N+ doped top forming a drain region.

In the embodiment illustrated in FIG. 2, the interface between the dielectric charge trapping structure 203 and the first dielectric structure 202 does not turn away from the channel region 200, thus the channel surface cross-section is the interface between the channel region 200 and the first dielectric structure 202 and is circular with an average radius 207. In the embodiment illustrated in FIG. 2, the interface between the conductive layer 205 and the second dielectric structure 204 does not turn away from the channel region 200, thus the conductor surface cross-section is that interface and is circular with an average radius 208.

In the embodiment illustrated in FIG. 2, the ratio of the area of the conductor surface 206 to the area of the channel surface 201 is equal to the ratio of the average radius 208 to the average radius 207, the ratio being a number greater than or equal to 1.2, including as much as about 2 or more.

In the embodiment illustrated in FIG. 2, a bias voltage between the channel region 200 and the conductive layer 205 results in an electric field which has a lower electric field strength at the conductor surface 206 than the electric field strength at the channel surface 201. In the embodiment illustrated in FIG. 2 and based on Gauss's law, $E_1 = R_2/R_1 * E_2$, and $$E_1 = \frac{V_G}{\ln(R_2/R_1)R_1}$$

where R1 is the average radius 207 of the channel surface 201, R2 is the average radius 208 of the conductor surface 206, E1 is the electric field strength at the channel surface 201, E2 is the electric field strength at the conductor surface 206, Vg is the bias voltage between the channel region 200 and the conductive layer 205, ln is the natural logarithmic mathematical function, and R2=R1+EOT, where EOT is the effective oxide thickness of the structures between the channel surface 201 and the conductor surface 206, where the effective oxide thickness is the actual thickness scaled by the dielectric constants of the structures, relative to the dielectric constant of silicon dioxide.

If the radius R1 is made small compared to the effective oxide thickness EOT, then E1 is significantly higher than E2. This can result in very high program/erase efficiency through the first dielectric structure 202, while suppressing unwanted charge leakage through the second dielectric structure 204.

For example, if R1 is about 20 nm, and R1 is equal to the EOT of the structures between the channel surface 201 and the conductor surface 206, then R2=R1+EOT=2*R1, and R2/R1=2 (the ratio of the areas is also about 2 for circular cylindrical surfaces), E1=2*E2, and E1=1.44*Vg/EOT, while E2=0.77*Vg/EOT. Therefore, the electric field E1 at the channel surface 201 is 1.44 times of the electric field of a comparable planar device, while the electric field E2 at the conductor surface 206 is only 0.77 times of the electric field of a comparable planar device. Embodiments in which R2/R1 is about 2 can have a ratio of the area A2 of the conductor surface to the area A1 of the channel surface in a range of about 1.8 to 2.2 for example.

Figure 3:
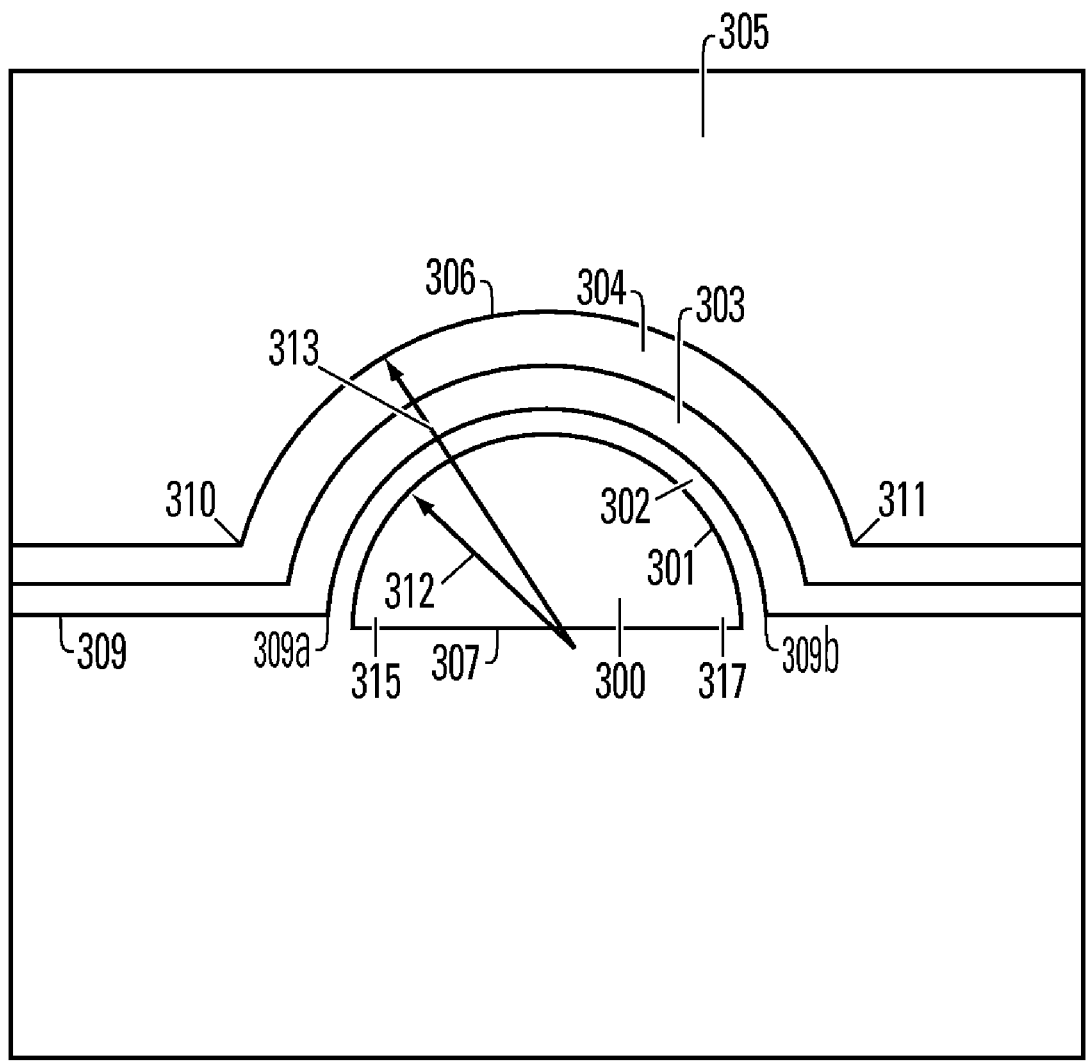
FIG. 3 illustrates a cross-sectional view taken along the channel width dimension of a dielectric charge trapping memory cell in accordance with one embodiment.

FIG. 3 illustrates a cross-sectional view taken along the channel width dimension W of a dielectric charge trapping memory cell in accordance with another embodiment having a semiconductor channel body on an insulating substrate, having a semi-circular cross-section. In the embodiment illustrated in FIG. 3, the channel region 300 comprises a channel surface 301, a first dielectric structure 302 is on the channel surface 301, a dielectric charge trapping structure 303 is on the first dielectric structure 302, a second dielectric structure 304 is on the dielectric charge trapping structure 303, and a conductive layer 305 having a conductor surface 306 is on the second dielectric structure 304, the conductor surface 306 overlying the dielectric charge trapping structure 303 and the channel surface 301. In the embodiment illustrated in FIG. 3, the source region and drain region are below the plane of the cross-section illustrated in FIG. 3 and above the plane of the cross-section illustrated in FIG. 3 respectively, such that the length of the channel surface 301 and the length of the conductor surface 306 are the distance along the channel region 300 from the source region to the drain region. In the embodiment illustrated in FIG. 3, the charge trapping structure has a bottom surface 309 which has corners 309a and 309b at which the interface between the charge trapping structure 303 and first dielectric structure 302 turns away from the channel region 300. In the embodiment illustrated in FIG. 3, the channel region includes a bottom surface 307 that is below an imaginary line that would connect charge trapping bottom surface corners 309a and 309b. This results in the regions 315, 317 at the edges of the channel region 300 being spaced further away from the dielectric charge trapping structure 303 than the major portion of the channel region 300. In the embodiment illustrated in FIG. 3, the interface between the conductor layer 305 and the second dielectric structure 304 includes corners 310 and 311 at which that interface turns away from the channel region 300.

In the embodiment illustrated in FIG. 3, the interface between the dielectric charge trapping structure 303 and the first dielectric structure 302 turns away from the channel region 300 at corners 309a and 309b, thus the channel surface cross-section is the arc having an average radius 312 that lies above an imaginary line which would connect corners 309a and 309b. In the embodiment illustrated in FIG. 3, the interface between the conductor layer 305 and the second dielectric structure 304 turns away at corners 310 and 311, thus the conductor surface is the arc having an average radius 313 extending from corner 310 to corner 311, such that the ratio of the area of conductor surface 306 to the area of the channel surface 301 is a number greater than or equal to 1.2, including as much as about 2 or more, as discussed above.

Figure 4:
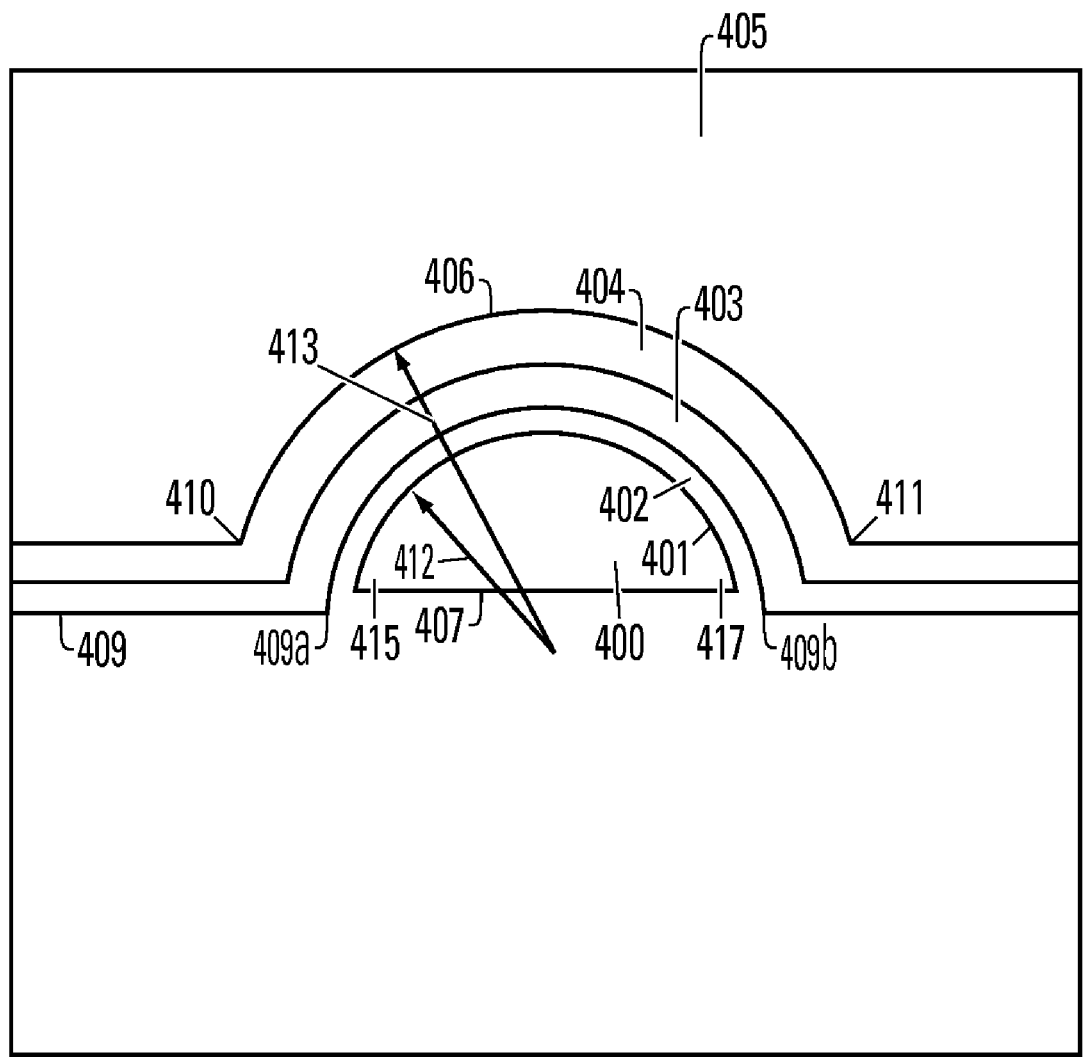
FIG. 4 illustrates a cross-sectional view taken along the channel width dimension of a dielectric charge trapping memory cell in accordance with one embodiment.

In the embodiment illustrated in FIG. 3, a bias voltage between the channel region 300 and the conductive layer 305 results in a lower electric field strength at the conductor surface 306 than the electric field strength at the channel surface 301. Similar electric field distribution occurs for a bias voltage between the conductive layer and one or both of the source and drain regions FIG. 4 illustrates a cross-sectional view taken along the channel width dimension W of a dielectric charge trapping memory cell in accordance with yet another embodiment. In the embodiment illustrated in FIG. 4, the channel region 400 comprises a channel surface 401, a first dielectric structure 402 is on the channel surface 401, a dielectric charge trapping structure 403 is on the first dielectric structure 402, a second dielectric structure 404 is on the dielectric charge trapping structure 403, and a conductive layer 405 having a conductor surface 406 is on the second dielectric structure 404, the conductor surface 406 overlying the dielectric charge trapping structure 403 and the channel surface 401. In the embodiment illustrated in FIG. 4, the source region and drain region are below the plane of the cross-section illustrated in FIG. 4 and above the plane of the cross-section illustrated in FIG. 4 respectively, such that the length of the channel surface 401 and the length of the conductor surface 406 are the distance along the channel region 400 from the source region to the drain region. In the embodiment illustrated in FIG. 4, the charge trapping structure 403 has a bottom surface 409 which has corners 409a and 409b at which the interface between the charge trapping structure 403 and the first dielectric structure 402 turns away from the channel region 400. In the embodiment illustrated in FIG. 4, the channel region includes a bottom surface 407 that is above an imaginary line that would connect corners 409a and 409b. The channel regions 415, 417 remain close to the dielectric charge trapping structure 403, which results in better control of the channel threshold voltage. In the embodiment illustrated in FIG. 4, the interface between the conductor layer 405 and the second dielectric structure 404 includes corners 410 and 411 at which that interface turns away from the channel region 400.

In the embodiment illustrated in FIG. 4, the cross-section of the channel surface 401 taken along the channel width dimension is the arc having an average radius 412. In the embodiment illustrated in FIG. 4, the cross-section of the conductor surface 406 is the arc having an average radius 413 extending from corner 410 to corner 411, such that the ratio of the area of conductor surface 406 to the area of the channel surface 401 is a number greater than or equal to 1.2, including as much as about 2 or more, as discussed above.

In the embodiment illustrated in FIG. 4, a bias voltage between the channel region 400 and the conductive layer 405 results in a lower electric field strength at the conductor surface 406 than the electric field strength at the channel surface 401.

Figure 5:
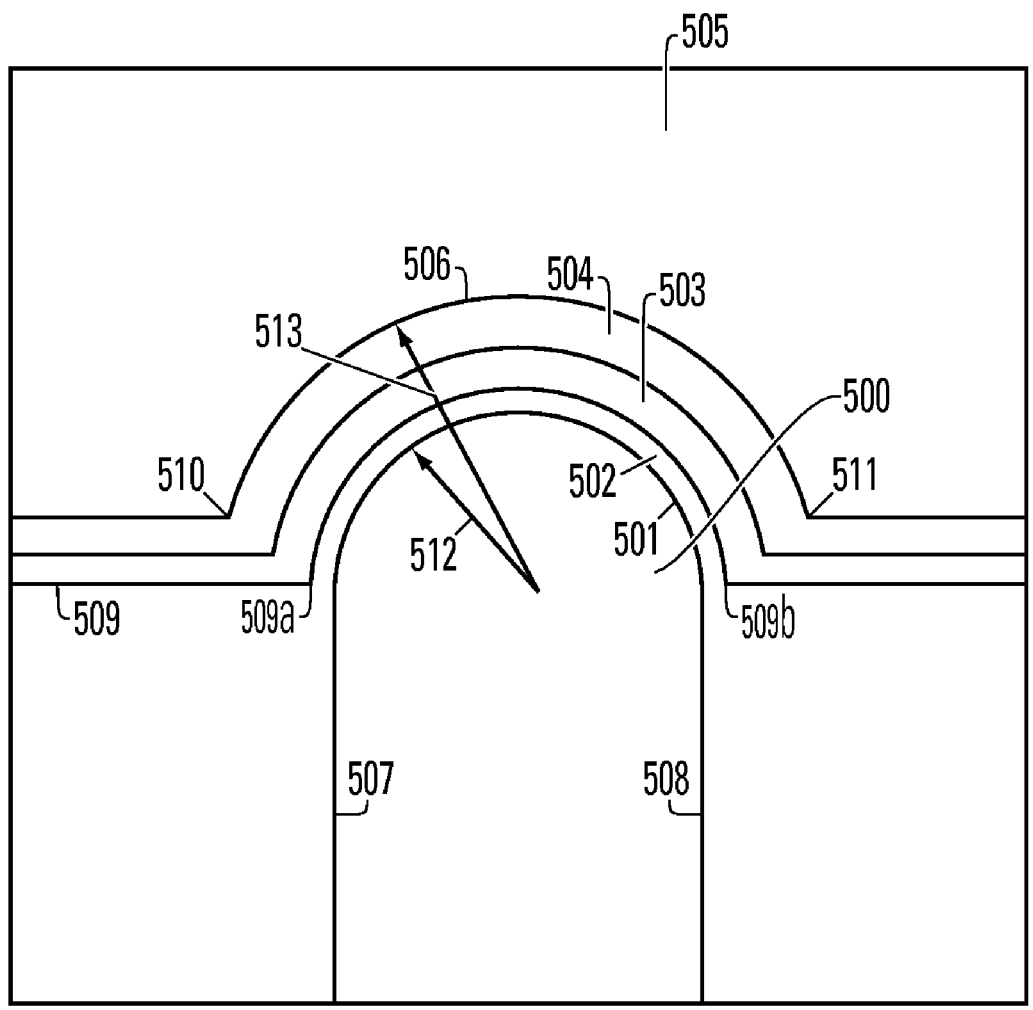
FIG. 5 illustrates a cross-sectional view taken along the channel width dimension of a dielectric charge trapping memory cell in accordance with one embodiment.

FIG. 5 illustrates a cross-sectional view taken along the channel width dimension W of a dielectric charge trapping memory cell in accordance with another embodiment. In the embodiment illustrated in FIG. 5, the channel region 500 comprises a channel surface 501, a first dielectric structure 502 is on the channel surface 501, a dielectric charge trapping structure 503 is on the first dielectric structure 502, a second dielectric structure 504 is on the dielectric charge trapping structure 503, and a conductive layer 505 having a conductor surface 506 on the second dielectric structure 504, the conductor surface 506 overlying the dielectric charge trapping structure 503 and the channel surface 501. In the embodiment illustrated in FIG. 5, the channel region 500 is on a fin-shaped semiconductor region having sides 507, 508. In some embodiments the fin-shaped region is formed continuous with (and therefore "body-tied") the semiconductor substrate on which the memory cell is formed. In the embodiment illustrated in FIG. 5, the source region and drain region are below the plane of the cross-section illustrated in FIG. 5 and above the plane of the cross-section illustrated in FIG. 5 respectively, such that the length channel surface 501 and the length of the conductor surface 506 are the distance along the channel region 500 from the source region to the drain region. In the embodiment illustrated in FIG. 5, the charge trapping structure 503 has a bottom surface 509 which has corners 509a and 509b at which the interface between the charge trapping structure 503 and the first dielectric structure 502 turns away from the channel region 500. In the embodiment illustrated in FIG. 5, the interface between the conductor layer 505 and the second dielectric structure 504 includes corners 510 and 511 at which that interface turns away from the channel region 500.

In the embodiment illustrated in FIG. 5, the sides 507, 508 of the fin are below an imaginary line that would connect corners 509a and 509b, thus the cross-section of the channel surface 501 is the arc having an average radius 512 above the imaginary line. In the embodiment illustrated in FIG. 5, the cross-section of the conductor surface 506 is the arc having an average radius 513 extending from corner 510 to corner 511, such that the ratio of the area of the conductor surface 506 to the area of the channel surface 501 is a number greater than or equal to 1.2, including as much as about 2 or more, as discussed above.

In the embodiment illustrated in FIG. 5, a bias voltage between the channel region 500 and the conductive layer 505 results in a lower electric field strength at the conductor surface 506 than the electric field strength at the channel surface 501.

Figure 6:
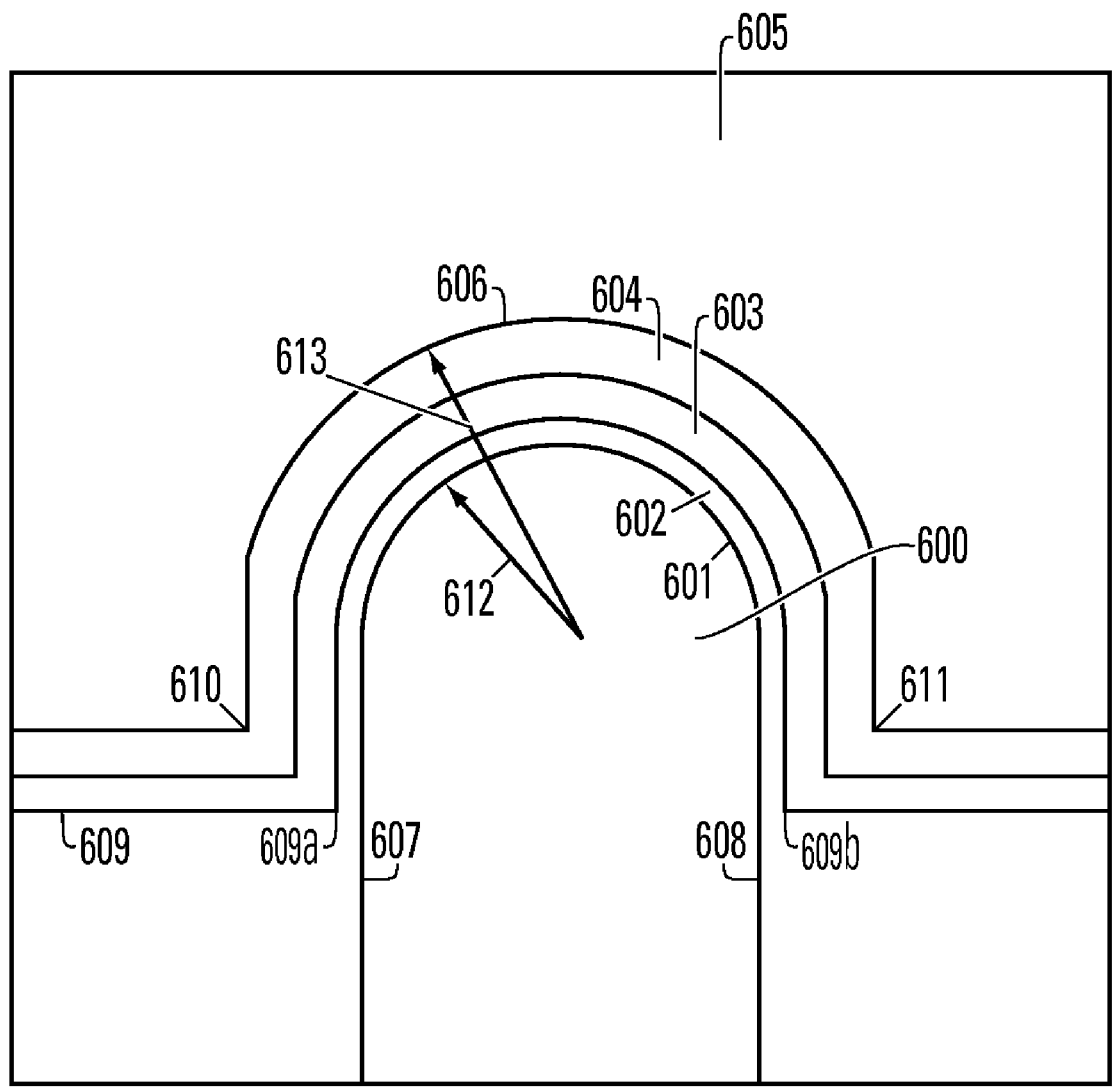
FIG. 6 illustrates a cross-sectional view taken along the channel width dimension of a dielectric charge trapping memory cell in accordance with one embodiment.

FIG. 6 illustrates a cross-sectional view taken along the channel width dimension W of a dielectric charge trapping memory cell in accordance with another embodiment. In the embodiment illustrated in FIG. 6, the channel region 600 comprises a channel surface 601, a first dielectric structure 602 is on the channel surface 601, a dielectric charge trapping structure 603 is on the first dielectric structure 602, a second dielectric structure 604 is on the dielectric charge trapping structure 603, and a conductive layer 605 having a conductor surface 606 on the second dielectric structure 604, the conductor surface 606 overlying the dielectric charge trapping structure 603 and the channel surface 601. In the embodiment illustrated in FIG. 6, the channel region 600 is on a fin-shaped semiconductor region having sides 607, 608. In the embodiment illustrated in FIG. 6, the source region and drain region are below the plane of the cross-section illustrated in FIG. 6 and above the plane of the cross-section illustrated in FIG. 6 respectively, such that the length of the channel surface 601 and the length of the conductor surface 606 are the distance along the channel region 600 from the source region to the drain region. In the embodiment illustrated in FIG. 6, the charge trapping structure 603 has a bottom surface 609 which has corners 609a and 609b at which the interface between the charge trapping structure 603 and the first dielectric structure 602 turns away from the channel region 600. In the embodiment illustrated in FIG. 5, the interface between the conductor layer 605 and the second dielectric structure 604 includes corners 610 and 611 at which that interface turns away form the channel region 600.

In the embodiment illustrated in FIG. 6, a portion of the sides 607, 608 are above an imaginary line that would connect corners 609a and 609b, thus the cross-section of the channel surface 601 is the combination of the arc having an average radius 612 and the portions of the sides 607, 608 that are above the imaginary line that would connect corners 609a and 609b. In the embodiment illustrated in FIG. 6, the cross-section of the conductor surface 606 is the interface between the conductor layer 605 and the second dielectric structure 604 extending from corner 610 to corner 611 and includes the arc having an average radius 613, such that the ratio of the area of the conductor surface 606 to the area of the channel surface 601 is a number greater than or equal to 1.2, including as much as about 2 or more, as discussed above.

In embodiments described herein the first dielectric structure can comprise, for example, silicon dioxide or a bandgap engineered tunneling barrier structure. A bandgap engineered tunneling barrier structure as contemplated herein provides a "modulated tunneling barrier" in that it suppresses direct tunneling at low electric field during charge retention in the charge trapping layer, while it allows efficient hole tunneling erase at high electric field due to the band offset in the hole tunneling barrier heights of the materials of the tunneling barrier structure. An example of a bandgap engineered tunneling barrier structure includes a bottom dielectric layer having a hole tunneling barrier height, a middle dielectric layer having a hole tunneling barrier height less than that of the bottom dielectric, and a top dielectric layer having a hole tunneling barrier height greater than that of the middle dielectric layer. Preferably, the hole tunneling current through a bandgap engineered tunneling barrier structure approaches that of a single layer when high electric fields are present.

In some embodiments the bandgap engineered tunneling barrier structure comprises multiple layers, an example of which comprises a first silicon dioxide layer, a silicon nitride layer on the first silicon dioxide layer, and a second silicon dioxide layer on the silicon nitride layer. In some preferred embodiments of a tri-layer bandgap engineered tunneling barrier structure, the first layer comprising silicon dioxide or similar material has a thickness less than or equal to about 20 Angstroms, in some embodiments the thickness being less than or equal to about 15 Angstroms, in some embodiments the thickness being between about 5 and 20 Angstroms, more preferably the thickness being between about 10 and 20 Angstroms, most preferably the thickness being between about 10 and 15 Angstroms. In some preferred embodiments of a tri-layer bandgap engineered tunneling barrier structure, the second layer comprising silicon nitride or similar material has a thickness less than or equal to about 20 Angstroms, more preferably the thickness being between about 10 and 20 Angstroms. It is found that embodiments in which the thickness of the second dielectric layer is greater than the thickness of the first dielectric layer, improved performance is achieve by reducing the electric field strength required to overcome the barrier height of the third dielectric layer. In some preferred embodiments of a tri-layer bandgap engineered tunneling barrier structure, the third layer comprising silicon dioxide or similar material has a thickness less than or equal to about 20 Angstroms, more preferably the thickness being between about 10 and about 20 Angstroms, most preferably the thickness being between about 15 and 20 Angstroms.

Bandgap engineered tunneling barrier structures in accordance with embodiments of the present invention can be prepared in a variety of ways. Any method, known or to be developed, for forming layers of suitable materials described herein can be used to deposit or form the layers. Suitable methods include, for example, thermal growth methods and chemical vapor deposition. For example, a first silicon dioxide or silicon oxynitride layer can be formed using any number of conventional oxidation approaches including, but not limited to thermal oxidation, radical (ISSG) oxidation, and plasma oxidation/nitridation, as well as chemical vapor deposition processes. A middle layer of silicon nitride can then be formed, for example, via chemical vapor deposition processes, or alternatively, by plasma nitridation of excess oxide or nitride formed on top of the first layer. A third layer comprising oxide in some embodiments, can be formed, for example, by oxidation or chemical vapor deposition.

Additional details on materials, processes, and characteristics of bandgap engineered tunneling barrier structures are disclosed in: provisional U.S. Patent Application No. 60/640,229 titled Non-Volatile Memory Devices and Methods of Manufacturing and Operating the Same, filed Jan. 3, 2005; provisional U.S. Patent Application Ser. No. 60/647,012 Non-Volatile Memory Devices and Arrays and Methods of Manufacturing and Operating the Same, filed on Jan. 27, 2005; provisional U.S. Patent Application No. 60/689,231 titled Non-Volatile Memory Having Gates Comprising Electron Injection Suppressing Materials, filed on Jun. 10, 2005; provisional U.S. patent application No. 60/689,314 titled Non-Volatile Memory Devices and Arrays and Methods of Manufacturing and Operating the Same, filed on Jun. 10, 2005; and non-provisional U.S. patent application Ser. No. 11/324,540 titled Non-Volatile Memory Cells, Memory Arrays Including the Same and Methods of Operating Cells and Arrays, filed on Jan. 3, 2006; the entire contents of each of which are incorporated herein by reference.

The second dielectric structure comprising silicon oxide can be formed, for example, by converting a portion of the dielectric charge trapping structure comprising silicon nitride to form the silicon oxide. In one example, a thermal conversion process may provide a high density or concentration of interfacial traps that can enhance the trapping efficiency of a memory device. For example, thermal conversion of nitride can be carried out at 1000 degrees C., while the gate flow ratio is H2:O2=1000:4000 sccm.

In embodiments described herein the dielectric charge trapping structure can comprise, for example, silicon nitride, SiON, $HfO_2$, $Al_2O_3$, dielectric embedded nano-particle trapping materials or other non-conductive charge trapping material. In embodiments in which the dielectric charge trapping structure comprises a layer of silicon nitride, the thickness of the layer is preferably greater than about 50 Angstroms, more preferably the thickness being between about 50 Angstroms and about 100 Angstroms for good charge trapping performance. For other materials the thickness is preferably sufficient to provide equivalent charge trapping performance.

In embodiments described herein the second dielectric structure can comprise, for example, silicon dioxide, $Al_2O_3$, or other insulating dielectric. In some preferred embodiments the second dielectric structure comprises a layer of silicon dioxide having a thickness greater than about 50 Angstroms, more preferably the thickness being between about 50 Angstroms and about 120 Angstroms for good performance in blocking tunneling between the charge trapping structure and the conductive layer. For other materials, the thickness is preferably sufficient to provide equivalent performance.

In embodiments described herein the conductive layer can comprise, for example, n-type or p-type doped polysilicon, high work function metal such as Pt, TaN, silicides, or other conductive material.

Figure 7:
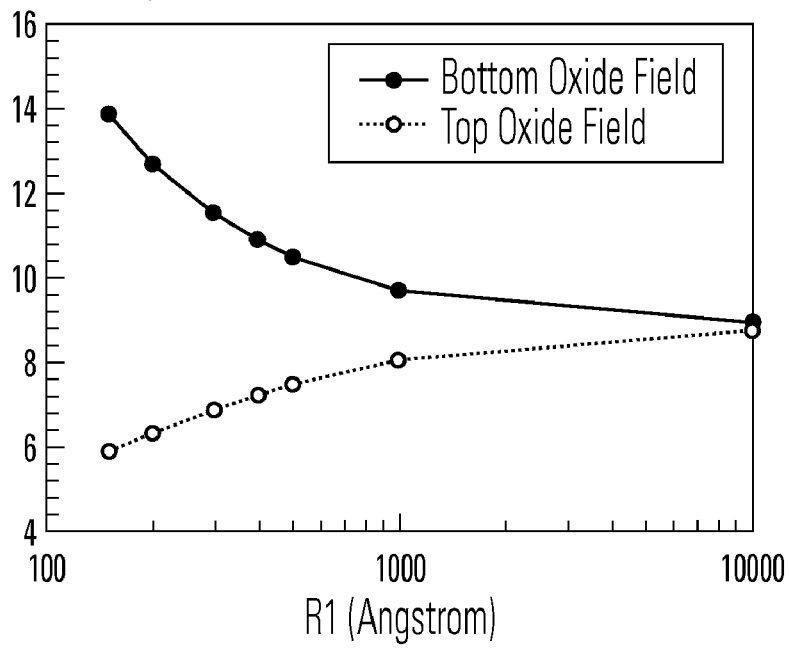
FIG. 7 illustrates a simulation of electric field strength at the channel surface and the conductor surface of a memory cell in accordance with one embodiment.

FIG. 7 illustrates a simulation of the electric field strength at the channel surface (labeled as "bottom oxide field" in FIG. 7) and the conductor surface (labeled as "top oxide field" in FIG. 7) of a memory cell with an EOT of 18 nm and a conductive layer to channel bias voltage of 15 V in accordance with one embodiment. The vertical axis in FIG. 7 is the electric field intensity in MV/cm and the horizontal axis is a logarithmic scale of the radius of curvature R1 of the cylindrical region of the channel surface in Angstroms. FIG. 7 clearly shows that when R1 decreases the electric field strength at the channel surface is increased, while the electric field strength at the conductor surface is reduced.

Figure 8:
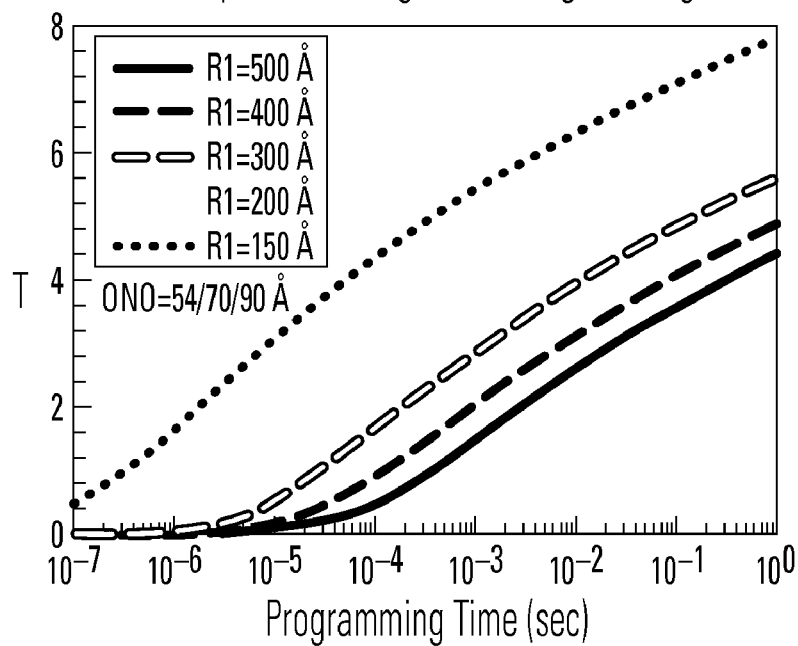
FIG. 8 illustrates a simulation of +FN programming time for various values of the radius of curvature of the cylindrical region of the channel surface of a memory cell in accordance with one embodiment.

FIG. 8 illustrates a simulation of +FN (Fowler-Nordheim tunneling with positive conductive layer to channel region bias voltage) programming time for various values of the radius of curvature R1 of the cylindrical region of the channel surface of a memory cell in accordance with one embodiment. The vertical axis in FIG. 8 is the change in threshold voltage of the memory cell and the horizontal axis is a logarithmic scale of programming time in seconds. FIG. 8 clearly shows that when R1 decreases the programming speed is greatly enhanced.

Figure 9:
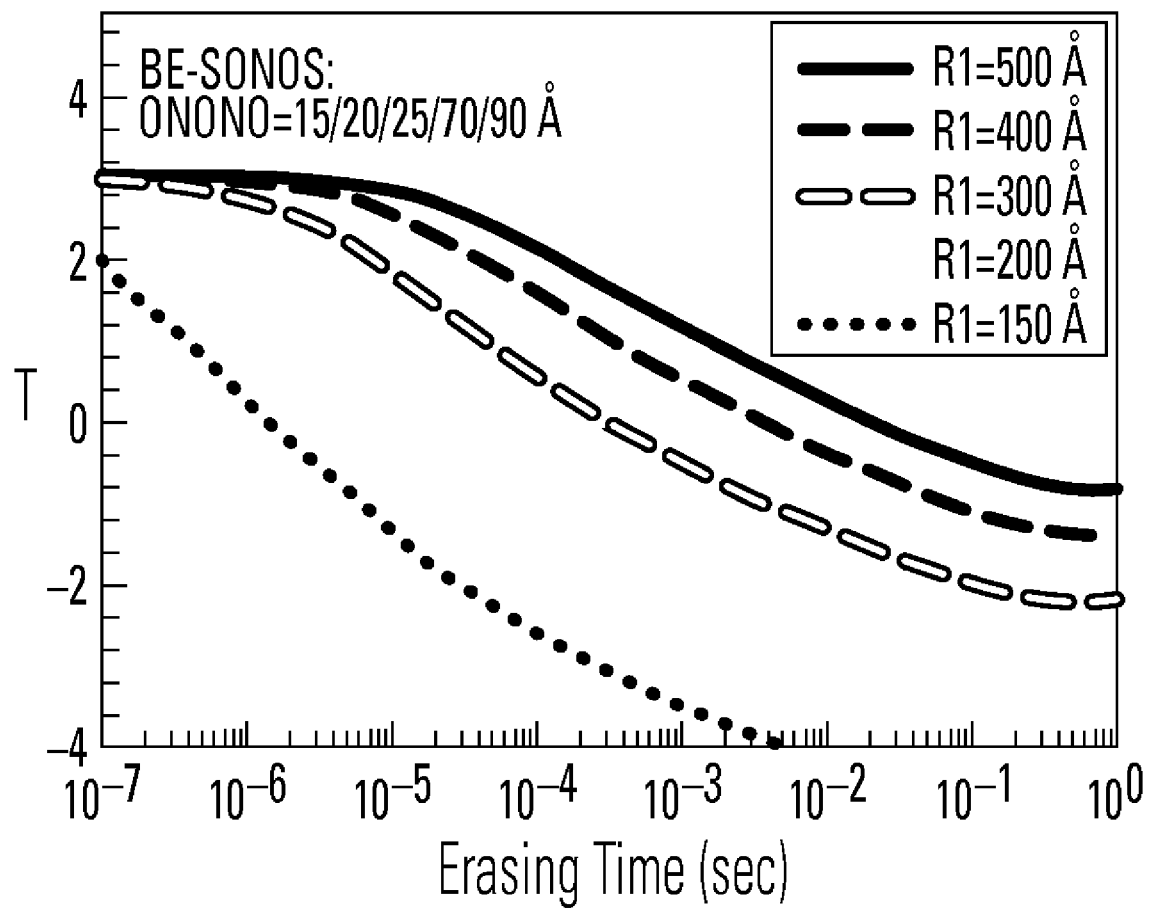
FIG. 9 illustrates a simulation of −FN erase time for various values of the radius of curvature of the cylindrical region of the channel surface of a memory cell having a bandgap engineered tunneling barrier structure in accordance with one embodiment.

FIG. 9 illustrates a simulation of –FN (Fowler-Nordheim tunneling with negative conductive layer to channel region bias voltage) erase time for various values of the radius of curvature R1 of the cylindrical region of the channel surface of a memory cell having a bandgap engineered tunneling barrier structure in accordance with one embodiment. The vertical axis in FIG. 9 is the change in threshold voltage of the memory cell and the horizontal axis is a logarithmic scale of programming time in seconds. FIG. 9 shows that when R1 decreases the erase speed is increased and the erase saturation is reduced. Moreover, the erase convergent Vt, particularly with n-type polysilicon gate devices, can be smaller because the gate electron injection during –FN is also reduced.

Figure 10:
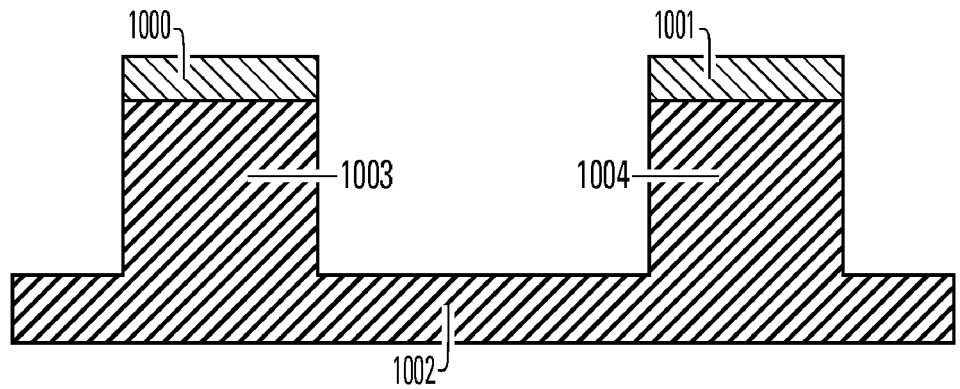
FIG. 10 illustrates a stage in the method for manufacturing a memory array comprising forming hard mask layer strips on a semiconductor substrate and etching to form relatively thick fins of semiconductor substrate in accordance with one embodiment.

FIGS. 10-15 illustrate an embodiment of a process flow for manufacturing a memory array, utilizing a dielectric charge trapping memory cell as described herein. FIG. 10 illustrates forming hard mask layer strips 1000, 1001 on a semiconductor substrate 1002 and etching to form relatively thick fins 1003, 1004 of semiconductor substrate 1002. In this example embodiment the hard mask layer strips 1000, 1001 comprise silicon nitride and the semiconductor substrate 1002 comprises silicon. The etching can be done, for example, using shallow trench isolation techniques or similar technologies.

Figure 11:
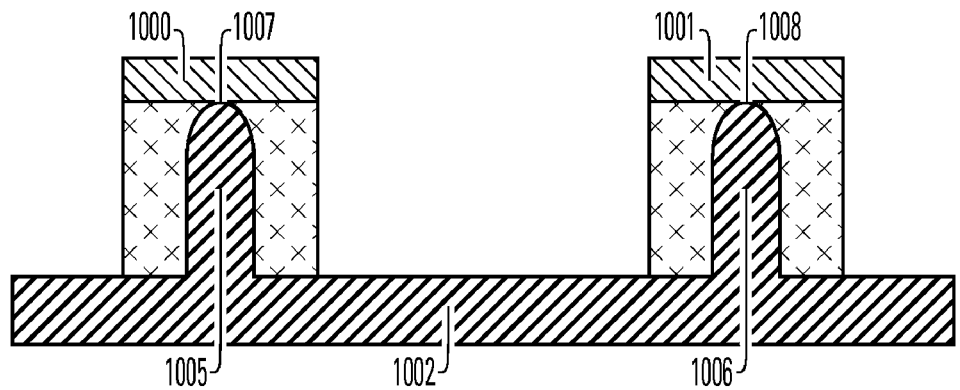
FIG. 11 illustrates a stage in the method for manufacturing a memory array comprising exposing the structure illustrated in FIG. 10 to an oxidation step which consumes a portion of the fins and results in fins with a sub-lithographic width in accordance with one embodiment.

FIG. 11 illustrates exposing the structure illustrated in FIG. 10 to an oxidation step which consumes a portion of the fins and results in fins 1005, 1006 with a sub-lithographic width. The oxide encroachment due to the oxidation step occurs more quickly at the interface between the fins 1005, 1006 and the hard mask layer strips 1000, 1001, resulting in rounding of the tips of the fins 1005, 1006 and the formation of cylindrical regions 1007, 1008 at the tip of the fins 1005, 1006.

Figure 12:
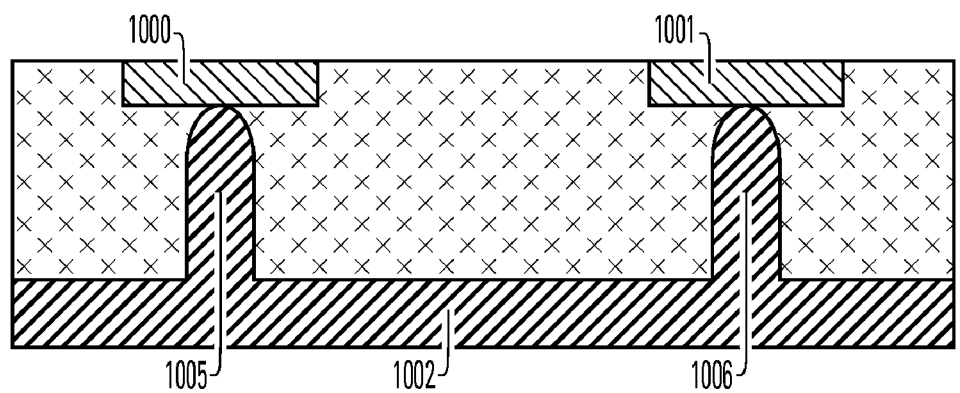
FIG. 12 illustrates a stage in the method for manufacturing a memory array comprising filling the structure illustrated in FIG. 11 with dielectric material in accordance with one embodiment.
Figure 13:
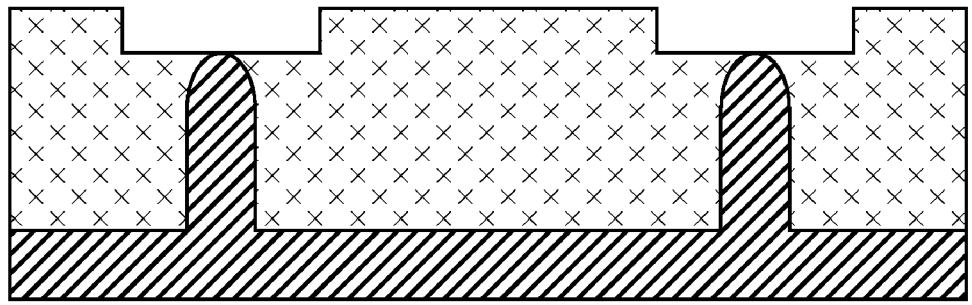
FIG. 13 illustrates a stage in the method for manufacturing a memory array comprising removing the hard mask layer strips from the structure illustrated in FIG. 12 in accordance with one embodiment.

Next, as illustrated in FIG. 12, the structure illustrated in FIG. 11 is filled with dielectric material, which in this example embodiment the dielectric material comprises silicon dioxide. The structure can be filled using, for example, a high density plasma HDP silicon dioxide deposition followed by chemical mechanical polishing CMP. Next, as shown in FIG. 13, the hard mask layer strips are removed.

Figure 14:
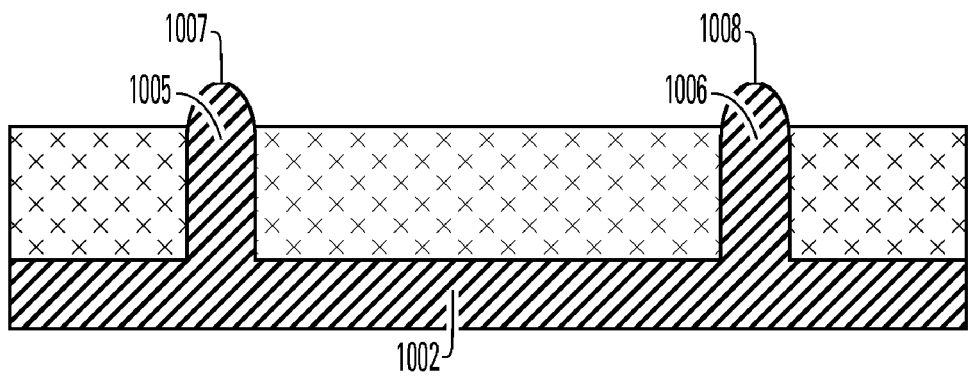
FIG. 14 illustrates a stage in the method for manufacturing a memory array comprising etching the structure illustrated in FIG. 13 to expose the cylindrical regions at the tips of the fins in accordance with one embodiment.
Figure 15:
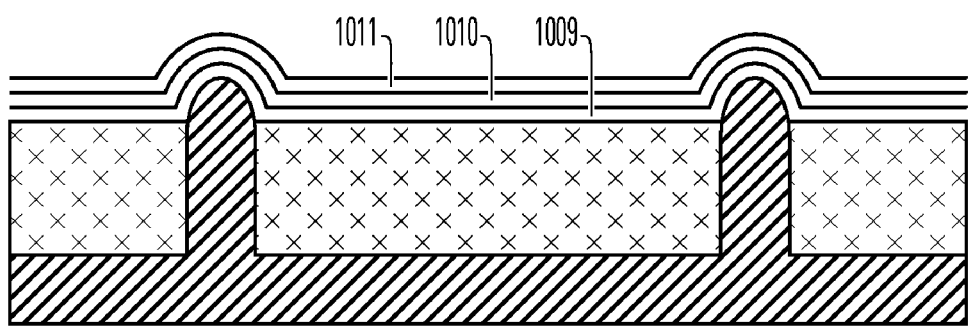
FIG. 15 illustrates a stage in the method for manufacturing a memory array comprising forming a first dielectric structure over the structure illustrated in FIG. 14, forming a dielectric charge trapping structure over the first dielectric structure, and forming a second dielectric structure over the dielectric charge trapping structure in accordance with one embodiment.

Next, etching is performed to expose at least the cylindrical regions 1007, 1008 at the tips of the fins 1005, 1006 as illustrated in FIG. 14. This etching can be done, for example, by a wet etch to remove the silicon dioxide fill at a slow rate. Then, as illustrated in FIG. 15, forming a first dielectric structure 1009 over the structure illustrated in FIG. 14, forming a dielectric charge trapping structure 1010 over the first dielectric structure 1009, and forming a second dielectric structure 1011 over the dielectric charge trapping structure 1010. Next a conductive layer is formed and patterned to form word lines. Contacts are then made to the fins between the word lines at appropriate locations, and the device is completed using interlayer dielectric film and metallization processes as is known in the art.

Figure 16:
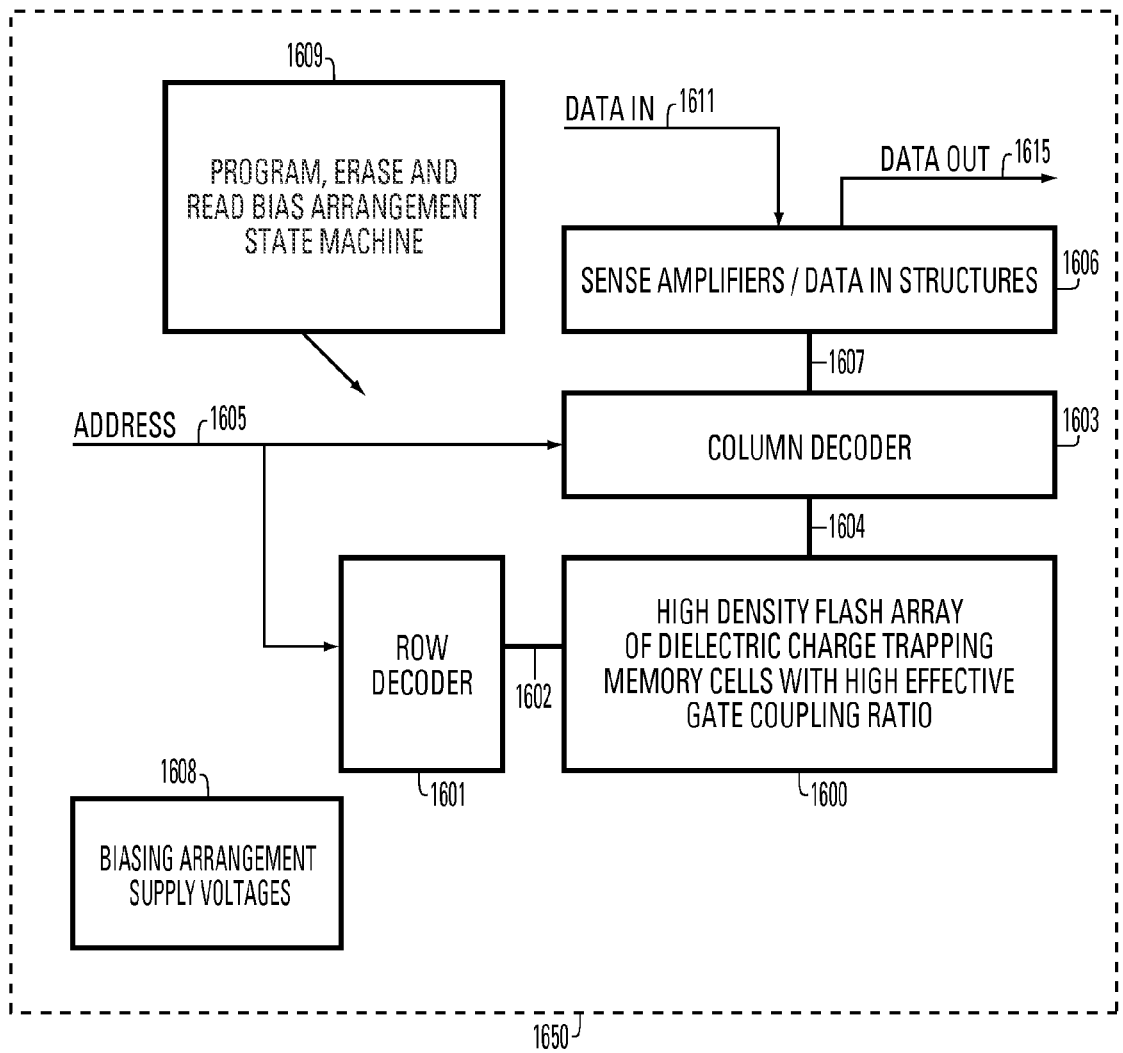
FIG. 16 is a simplified diagram in accordance with one embodiment of an integrated circuit with an array of charge trapping memory cells and control circuitry.

FIG. 16 is a simplified diagram of an integrated circuit with an array of charge trapping memory cells as described herein. The integrated circuit 1650 includes a memory array 1600 implemented using nonvolatile memory cells as described herein on a semiconductor substrate. The memory cells of array 1600 may be interconnected in parallel, in series, or in a virtual ground array. A row decoder 1601 is coupled to a plurality of word lines 1602 arranged along rows in the memory array 1600. Memory cells as described herein can be configured in NAND arrays, and NOR arrays, or other types of array structures. A column decoder 1603 is coupled to a plurality of bit lines 1604 arranged along columns in the memory array 1600. Addresses are supplied on bus 1605 to column decoder 1603 and row decoder 1601. Sense amplifiers and data-in structures in block 1606 are coupled to the column decoder 1603 via data bus 1607. Data is supplied via the data-in line 1611 from input/output ports on the integrated circuit 1650, or from other data sources internal or external to the integrated circuit 1650, to the data-in structures in block 1606. Data is supplied via the data-out line 1615 from the sense amplifiers in block 1606 to input/output ports on the integrated circuit 1650, or to other data destinations internal or external to the integrated circuit 1650. A bias arrangement state machine 1609 controls the application of bias arrangement supply voltages 1608, such as for the erase verify and program verify voltages, and the arrangements for programming, erasing, and reading the memory cells, such as with the band-to-band currents. The bias arrangement state machine is adapted to apply bias arrangements for programming by +FN tunneling including a positive voltage between the gate and channel or between the gate and one or both of the source and drain terminals sufficient to induce electron tunneling through the tunnel dielectric structure into the charge trapping structure. Using the cylindrical channel or similar cell structure, the voltages required for +FN tunneling can be reduced compared to planar channel devices. Also, the bias arrangement state machine is adapted to apply bias arrangements for erasing by −FN tunneling including a negative voltage between the gate and channel or between the gate and one or both of the source and drain terminals sufficient to induce hole tunneling through the tunnel dielectric structure into the charge trapping structure. Alternatively, the bias arrangement state machine is adapted to apply bias arrangements sufficient to induce electron ejection from the charge trapping structure through the tunnel dielectric structure to at least one of the source, drain and channel.

The array may be combined on the integrated circuit with other modules, such as processors, other memory arrays, programmable logic, dedicated logic etc.

While the present invention is disclosed by reference to the preferred embodiments and examples detailed above, it is to be understood that these examples are intended in an illustrative rather than a limiting sense. It is to be understood and appreciated that that the fabrication steps and structures described herein do not cover a complete process flow for the manufacture of entire integrated circuits. The present invention may be practiced in conjunction with various integrated circuit fabrication techniques that are known in the art or to be developed. It is contemplated that modifications and combinations will readily occur to those skilled in the art, which modifications and combinations will be within the spirit of the invention and the scope of the following claims.

What is claimed is:

1. A memory cell comprising:
a source region and a drain region separated by a semiconductor channel region, the channel region having a channel surface having an area A1 including a first cylindrical region;
a first dielectric structure on the channel surface;
a dielectric charge trapping structure on the first dielectric structure;
a second dielectric structure on the dielectric charge trapping structure;
a conductive layer having a conductor surface having an area A2 including a second cylindrical region on the second dielectric structure, the conductor surface overlying the dielectric charge trapping structure and the channel surface;
the ratio of the area A2 to the area A1 being greater than or equal to 1.2.

2. The memory cell of claim 1, wherein the ratio of the area A2 to the area A1 being greater than or equal to 1.8.

3. The memory cell of claim 1, wherein a cross-section of the first cylindrical region of the channel surface along the channel width dimension is circular.

4. The memory cell of claim 3, wherein a cross-section of the second cylindrical region of the conductor surface along the channel width dimension is circular.

5. The memory cell of claim 1, wherein a cross-section of the first cylindrical region of the channel surface along the channel width dimension is circular with an arc of less than 360 degrees.

6. The memory cell of claim 5, wherein a cross-section of the second cylindrical region of the conductor surface along the channel width dimension is circular with an arc of less than 360 degrees.

7. The memory cell of claim 1, including:
the charge trapping structure having a first bottom surface;
the channel region having a second bottom surface;
a cross-section of the first bottom surface along the channel width dimension comprising a first corner and a second corner at which the first bottom surface turns away from the channel region;
a cross-section of the second bottom surface along the channel width dimension comprising a first line; and
an imaginary second line connecting the first corner and the second corner, such that the first line is at a level below the imaginary second line.

8. The memory cell of claim 1, including:
the charge trapping structure having a first bottom surface;
the channel region having a second bottom surface;
a cross-section of the first bottom surface along the channel width dimension having a first corner and a second corner at which the first bottom surface turns away from the channel region;
a cross-section of the second bottom surface along the channel width dimension comprising a first line; and
an imaginary second line connecting the first corner and the second corner, such that the first line is at a level above the imaginary second line.

9. The memory cell of claim 1, further comprising a semiconductor fin structure, wherein the semiconductor channel region is on the semiconductor fin structure.

10. The memory cell of claim 1, wherein the structures between the channel surface and the conductor surface have an effective oxide thickness and the first cylindrical region of the channel surface has an average radius that is less than the effective oxide thickness.

11. The memory cell of claim 1, wherein the first dielectric structure comprises silicon dioxide.

12. The memory cell of claim 1, wherein the first dielectric structure comprises a bandgap engineered tunneling barrier structure.

13. A memory cell comprising:
a source region and a drain region separated by a semiconductor channel region, the channel region having a channel surface having an area A1 including a first cylindrical region;
a first dielectric structure on the channel surface;
a dielectric charge trapping structure on the first dielectric structure;
a second dielectric structure on the dielectric charge trapping structure;
a conductive layer having a conductor surface having an area A2 including a second cylindrical region on the second dielectric structure, the conductor surface overlying the dielectric charge trapping structure and the channel surface;
the ratio of the area A2 to the area A1 being greater than or equal to 1.2; wherein the first dielectric structure comprises:
a first dielectric layer having a hole tunneling barrier height;
a second dielectric layer on the first dielectric layer, the second dielectric layer having a hole tunneling barrier height less than that of the first dielectric layer; and
a third dielectric layer on the second dielectric layer, the third dielectric layer having a hole tunneling barrier height greater than that of the second dielectric layer.

14. The memory cell of claim 13, wherein the first dielectric layer comprises silicon dioxide, the second dielectric layer comprises silicon nitride, and the third dielectric layer comprises silicon dioxide.

15. The memory cell of claim 13, wherein the first dielectric layer has a thickness less than or equal to about 20 Angstroms.

16. The memory cell of claim 13, wherein the first dielectric layer has a thickness between about 10 and about 20 Angstroms.

17. The memory cell of claim 13, wherein the first dielectric layer has a thickness between about 10 and about 15 Angstroms.

18. The memory cell of claim 13, wherein the first dielectric layer has a thickness between about 5 and about 20 Angstroms.

19. The memory cell of claim 13, wherein the first dielectric layer has a thickness less than or equal to about 15 Angstroms.

20. The memory cell of claim 13, wherein the second dielectric layer has a thickness less than or equal to about 20 Angstroms.

21. The memory cell of claim 13, wherein the second dielectric layer has a thickness between about 10 and about 20 Angstroms.

22. The memory cell of claim 13, wherein the third dielectric layer has a thickness less than or equal to about 20 Angstroms.

23. The memory cell of claim 13, wherein the third dielectric layer has a thickness between about 15 and about 20 Angstroms.

24. The memory cell of claim 13, wherein the third dielectric layer has a thickness between about 10 and about 20 Angstroms.

25. The memory cell of claim 1, wherein the dielectric charge trapping structure comprises silicon nitride.

26. The memory cell of claim 1, wherein the second dielectric structure comprises silicon dioxide.

27. The memory cell of claim 1, wherein the conductive layer comprises polysilicon.

28. A memory device comprising:
an array of memory cells on a semiconductor substrate;
the memory cells comprising a source region and a drain region separated by a semiconductor channel region, the channel region having a channel surface having an area A1 including a first cylindrical region, a first dielectric structure on the channel surface, a dielectric charge trapping structure on the first dielectric structure, a second dielectric structure on the dielectric charge trapping structure, a conductive layer having a conductor surface having an area A2 including a second cylindrical region on the second dielectric structure, the conductor surface overlying the dielectric charge trapping structure and the channel surface of the channel region, and the ratio of the area A2 to the area A1 being greater than or equal to 1.2; and
a bias arrangement state machine adapted to apply bias arrangements to the memory cells for programming and to apply bias arrangements to the memory cells for erasing, wherein the bias arrangement for programming includes a positive voltage between the conductive layer and at least one of the channel region the source region and drain region sufficient to induce electron tunneling through the first dielectric structure into the dielectric charge trapping structure, wherein the bias arrangement for erasing includes a negative voltage between the conductive layer and at least one of the channel region, the source region and drain region sufficient to induce hole tunneling through the first dielectric structure into the charge trapping structure.

* * * * *